(12) United States Patent
Sakamoto (10) Patent No.: US 10,332,816 B2
(45) Date of Patent: Jun. 25, 2019

(54) CIRCUIT DEVICE AND METHOD OF MANUFACTURING THE SAME

(71) Applicant: Semiconductor Components Industries, LLC, Phoenix, AZ (US)

(72) Inventor: Hideyuki Sakamoto, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 484 days.

(21) Appl. No.: 14/661,080

(22) Filed: Mar. 18, 2015

(65) Prior Publication Data

US 2015/0327372 A1   Nov. 12, 2015

Related U.S. Application Data

(62) Division of application No. 13/331,784, filed on Dec. 20, 2011, now Pat. No. 8,995,139.

(30) Foreign Application Priority Data

Dec. 24, 2010   (JP) ................................ 2010-287508

(51) Int. Cl.
*H05K 3/28* (2006.01)
*B29C 45/14* (2006.01)
(Continued)

(52) U.S. Cl.
CPC .... *H01L 23/3107* (2013.01); *B29C 45/14008* (2013.01); *B29C 45/14819* (2013.01);
(Continued)

(58) Field of Classification Search
CPC ... H01L 23/31; H01L 23/3107; H01L 21/565; H01L 21/56; H01L 21/563; H01L 23/28;
(Continued)

(56) References Cited

U.S. PATENT DOCUMENTS 5,289,034 A   2/1994  Hundt
5,398,155 A   3/1995  Sato et al.
(Continued)

FOREIGN PATENT DOCUMENTS

JP   S5879739 A   5/1983
JP   11340257     12/1999
(Continued)

OTHER PUBLICATIONS

English abstract for JP2007324274, Dec. 2007.*
(Continued)

*Primary Examiner* — Philip C Tucker
*Assistant Examiner* — Jimmy R Smith, Jr.
(74) *Attorney, Agent, or Firm* — IPTechLaw (57) ABSTRACT

Provided is a circuit device in which encapsulating resin to encapsulate a circuit board is optimized in shape, and a method of manufacturing the circuit device. A hybrid integrated circuit device, which is a circuit device according to the present invention includes a circuit board, a circuit element mounted on a top surface of the circuit board, and encapsulating resin encapsulating the circuit element, and coating the top surface, side surfaces, and a bottom surface of the circuit board. In addition, the encapsulating resin is partly recessed and thereby provided with recessed areas at two sides of the circuit board. The providing of the recessed areas reduces the amount of resin to be used, and prevents the hybrid integrated circuit device from being deformed by the cure shrinkage of the encapsulating resin.

20 Claims, 8 Drawing Sheets

(51) Int. Cl.
*H01L 23/31* (2006.01)
*H01L 21/56* (2006.01)
*B29L 31/34* (2006.01)
*H05K 3/00* (2006.01)

(52) U.S. Cl.
CPC .......... *H01L 21/565* (2013.01); *H05K 3/284* (2013.01); *B29L 2031/3425* (2013.01); *H01L 2224/48091* (2013.01); *H01L 2224/73265* (2013.01); *H01L 2924/13055* (2013.01); *H01L 2924/13091* (2013.01); *H01L 2924/19105* (2013.01); *H05K 3/0052* (2013.01); *H05K 3/0097* (2013.01); *H05K 2201/09154* (2013.01); *H05K 2203/1316* (2013.01); *H05K 2203/1545* (2013.01)

(58) Field of Classification Search
CPC .......... H01L 23/29; H01L 23/315; H05K 2201/09154; H05K 2203/1316; H05K 3/284; B29C 45/14819
USPC .......... 264/241, 259, 271.1, 272.11, 328.12
See application file for complete search history.

(56) References Cited

U.S. PATENT DOCUMENTS

| | | |
|---|---|---|
| 5,918,112 A | 6/1999 | Shah et al. |
| 6,061,251 A | 5/2000 | Hutchison et al. |
| 6,211,462 B1 | 4/2001 | Carter et al. |
| 6,396,125 B1 | 5/2002 | Soyano |
| 6,482,674 B1 | 11/2002 | Kinsman |
| 6,828,662 B2 | 12/2004 | Sekiguchi et al. |
| 7,232,957 B2 | 6/2007 | Mizutani et al. |
| 2003/0003629 A1* | 1/2003 | Koike ............ H01L 21/565 438/124 |
| 2006/0065421 A1 | 3/2006 | Arai et al. |
| 2007/0132112 A1* | 6/2007 | Ozaki ............ H01L 21/565 257/787 |
| 2009/0135572 A1 | 5/2009 | Takakusaki et al. |
| 2010/0065960 A1* | 3/2010 | Mino ............ H01L 21/565 257/693 |

FOREIGN PATENT DOCUMENTS

| | | | | |
|---|---|---|---|---|
| JP | 2007324274 A | * | 12/2007 | ............ H01L 24/97 |
| JP | 2008112928 A | | 5/2008 | |
| KR | 1020060092692 | | 8/2006 | |

OTHER PUBLICATIONS

Glossary of Terms from PIM Plastic Molding Company, Mar. 2014, p. 2.*

Notification of Reasons for Refusal for Japanese Patent Application No. 2010-287508 (foreign counterpart to U.S. Appl. No. 13/331,784) dated Dec. 2, 2014.

Office Action dated Apr. 29, 2013, directed to Korean Patent Application No. 10-2011-0140908; 4 pages.

* cited by examiner

Prior Art

CIRCUIT DEVICE AND METHOD OF MANUFACTURING THE SAME

This application is a divisional of U.S. application Ser. No. 13/331,784, filed Dec. 20, 2011, which claims priority from Japanese Patent Application Number JP 2010-287508 filed on Dec. 24, 2010. The contents of these applications are incorporated herein by reference in their entirety

BACKGROUND OF THE INVENTION

1. Field of the Invention

The present invention relates to a circuit device and a method of manufacturing the circuit device. In particular the present invention relates to a circuit device in which encapsulating resin coats a circuit board having a circuit element mounted thereon, and a method of manufacturing the circuit device.

2. Description of the Related Art

Figure 8:
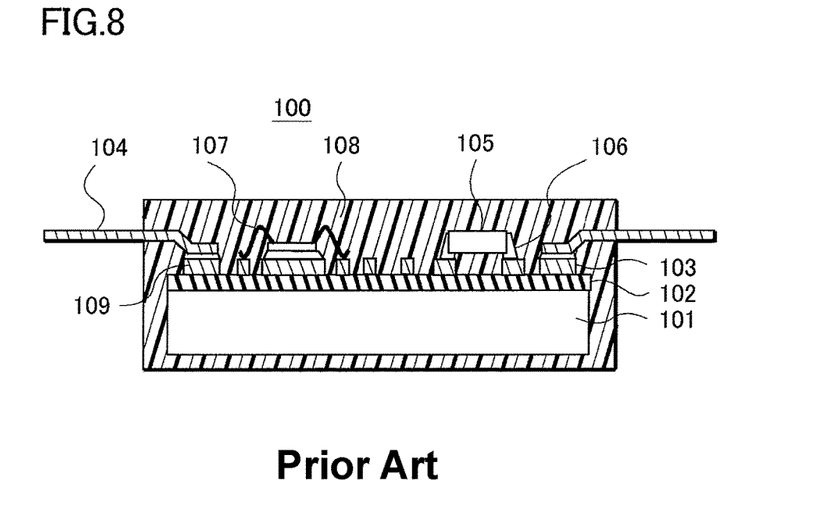
FIG. 8 is a sectional view illustrating a circuit device of the related art.

FIG. 8 shows a hybrid integrated circuit device 100 of the related art having a structure in which an electric circuit mounted on the surface of a board 101 (see Japanese Patent Application Publication No. Hei 11-340257). A conductive pattern 103 is formed on the surface of the rectangular board 101 with an insulating layer 102 formed in between. A circuit element 105 is fixed at a predetermined position on the conductive pattern 103, and thereby a predetermined electric circuit is formed. In this example, a semiconductor element and a chip element are connected, as circuit elements, to the conductive pattern 103. A lead 104 is connected to a pad 109 that is a portion of the conductive pattern 103 formed in a peripheral area of the board 101. The lead 104 functions as an external terminal. Encapsulating resin 108 has a function of encapsulating the electric circuit formed on the surface of the board 101.

The method of manufacturing the hybrid integrated circuit device 100 can be summarized as follows. Firstly, a hybrid integrated circuit including the conductive pattern 103 and the circuit element 105 is mounted on the top surface of the board 101. Then, the lead 104 is fixed, with a solder, to the pad 109 located in a peripheral area of the board 101. Then, the encapsulating resin 108 is formed to cover the board 101 and the lead 104. The encapsulating resin 108 is usually formed by transfer molding using a mold. For the transfer molding, a mold with an internal-wall shape corresponding to the external shape of the encapsulating resin 108 is firstly prepared, and the board 101 is placed in the cavity of the mold. Then, encapsulating resin in the form of a liquid is injected into the cavity, and thereby the top surface, the side surfaces, and the bottom surface of the board 101 are coated with the encapsulating resin. Then, the encapsulating resin in the cavity is cured by heating. Then, the hybrid integrated circuit device 100 encapsulated by the encapsulating resin 108 is taken out of the mold.

SUMMARY OF THE INVENTION

In a case where the hybrid integrated circuit device 100 with the above-described configuration is provided with a fixation portion for screwing, which is formed of the encapsulating resin 108 projecting from a side of the board 101, a larger amount of the encapsulating resin 108 is needed, which results in a higher cost.

The hybrid integrated circuit device 100 has another problem that cure shrinkage of the encapsulating resin 108 inflects the board 101 into a concave shape in the view of FIG. 8. This is because a larger amount of encapsulating resin 108 coats the top surface of the board 101 than that coating the bottom surface of the board 101, and accordingly a residual stress generated by the shrinkage of the encapsulating resin 108 is larger on the top surface of the board 101 than on the bottom surface of the board 101.

The hybrid integrated circuit device 100 has still another problem that voids, which are not filled with the encapsulating resin 108, may possibly be formed under the board 101. Specifically, in order to improve heat dissipation of the hybrid integrated circuit device 100 in use, it is preferable to make the encapsulating resin 108 coating the bottom surface of the board 101 as thin as possible. For example, the encapsulating resin 108 coating the bottom surface of the board 101 preferably has a thickness of 0.5 mm or even smaller. Thus, the heat generated by the operations of the circuit element 105 is released satisfactorily through the board 101 and the encapsulating resin 108 coating the backside surface of the board 101. To achieve this, the distance between the bottom surface of the board 101 and the internal wall of the mold in the process of resin encapsulation needs to be narrowed. Such a narrow gap, however, may possibly prevent the encapsulating resin 108 from fully spreading into this narrow gap, and as a consequence, may cause the formation of voids under the board 105.

The present invention is made in view of the problems described above, and aims to provide a circuit device in which encapsulating resin to encapsulate a circuit board is optimized in shape, and a method of manufacturing the circuit device.

A circuit device according to the present invention includes: a circuit board having a conductive pattern and a circuit element mounted on a top surface of the circuit board; encapsulating resin coating the top surface, side surfaces, and a bottom surface of the circuit board; leads fixed to the circuit board and each having an end drawn from the encapsulating resin; and a recessed area formed by recessing a portion of the encapsulating resin in a thickness direction at a side of the circuit board.

A method of manufacturing a circuit device according to the present invention includes the steps of: preparing a circuit board having a conductive pattern and a circuit element mounted on a top surface of the circuit board; setting the circuit board in a cavity of a set of molds including an upper mold and a lower mold so that the top surface of the circuit board faces an internal wall of the upper mold; and injecting encapsulating resin into the cavity through a gate, and thereby coating the top surface, side surfaces and a bottom surface of the circuit board with the encapsulating resin, in which a guiding portion is formed by projecting downwards a portion of the internal wall of the upper mold located in a region between the circuit board and the gate, and the encapsulating resin is made to flow along the guiding portion into a gap between the bottom surface of the circuit board and an internal wall of the lower mold.

BRIEF DESCRIPTION OF THE DRAWINGS

FIG. 2A is a perspective view illustrating the same hybrid integrated circuit device that is illustrated in FIG. 1A but is depicted upside down.

DESCRIPTION OF THE INVENTION

<First Embodiment: Configuration of Circuit Device>

Figure 1A:
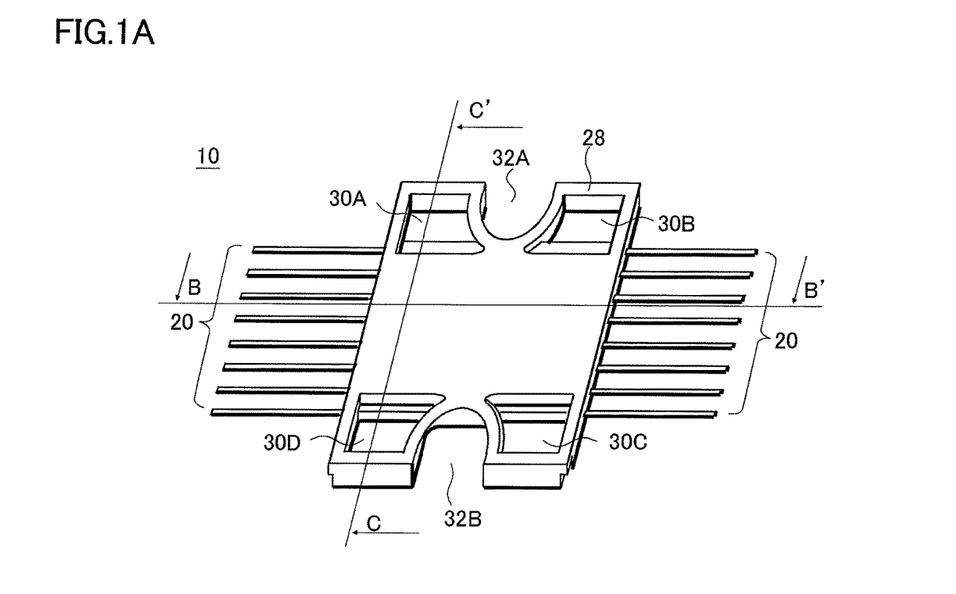
FIG. 1A shows a perspective view of a diagram illustrating a hybrid integrated circuit device, a circuit device of preferred embodiments of the invention.
Figure 1B:
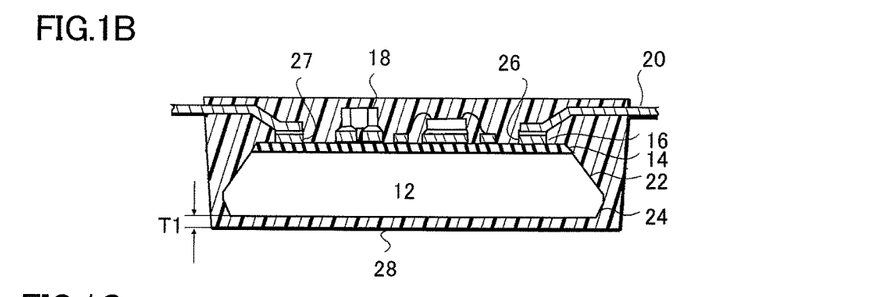
FIG. 1B shows a sectional view of the hybrid integrated circuit device shown in FIG. 1A.
Figure 1C:
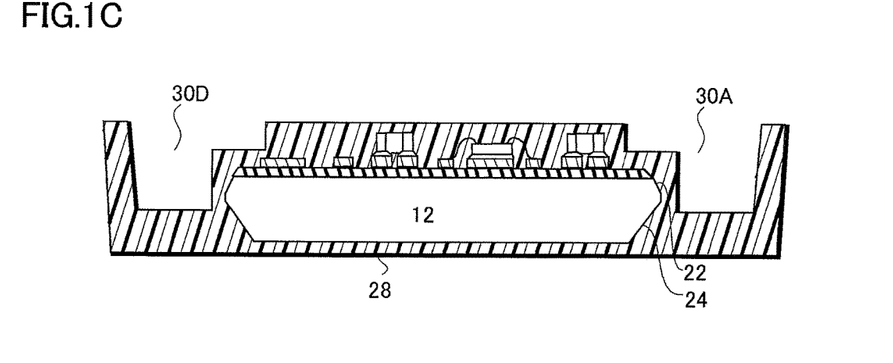
FIG. 1C shows another sectional view of the hybrid integrated circuit device shown in FIG. 1A.

The configuration of a hybrid integrated circuit device 10 (circuit device) is described below by referring to FIGS. 1A-C. FIG. 1A is a perspective view illustrating the hybrid integrated circuit device 10 seen from above. FIG. 1B is a sectional view taken along the line B-B' in FIG. 1A. FIG. 1C is a sectional view taken along the line C-C' in FIG. 1A.

As FIGS. 1A and 1B shows, the hybrid integrated circuit device 10 includes a circuit board 12 and a hybrid integrated circuit including a circuit element 18 and mounted on top of the circuit board 12. Both the hybrid integrated circuit and the circuit board 12 are encapsulated with encapsulating resin 28. Leads 20 are connected to the hybrid integrated circuit built in the hybrid integrated circuit device 10, and are drawn from the encapsulating resin 28.

The circuit board 12 shown in FIG. 1B is a metal substrate made mainly of aluminum, copper, or the like. The planar size of the circuit board 12 is approximately 2.0 cm×1.0 cm, for example. The thickness of the circuit board 12 is approximately 1.5 mm, for example. If the circuit board 12 is made of aluminum, both the top surface and the bottom surface of the circuit board 12 are coated with alumite films formed by anodization. Each side of the circuit board 12 has sloping surfaces that extend outwards. Specifically, two sloping surfaces are formed: a first sloping surface 22 that extends continuously and obliquely outwards from the top surface of the circuit board 12; and a second sloping surface 24 that extends continuously and obliquely outwards from the bottom surface of the circuit board 12.

An insulating layer 14 is formed to cover entirely the top surface of the circuit board 12, and is made of a resin material filled densely with granular filler such as alumina. The insulating layer 14 has a thickness of approximately 50 µm, for example.

A conductive pattern 16 is formed by etching, into a predetermined shape, a foil of copper or of a conductive material, attached to the top surface of the insulating layer 14. In this embodiment, mount pads where the circuit element 18 is mounted are formed with the conductive pattern 16. Wiring portions that connect the mount pads to one another are also formed with the conductive pattern 16. In addition, as FIG. 1B shows, pads 26 and 27 are provided each along one of two opposite sides of the circuit board 12. The inner-side end of each lead 20 is soldered to either one of these pads 26 and 27.

The circuit element 18 is mounted at a predetermined position on the conductive pattern 16 by using a conductive, bonding material such as a solder. A wide variety of elements are used as the circuit element 18. For example, passive elements such as chip capacitors and chip resistors, active elements such as transistors, or resin-encapsulated packages can be used for this purpose. If a power transistor, such as a MOSFET and an IGBT, is mounted as the circuit element 18, the transistor is mounted on a heat sink that is fixed to the top of the conductive pattern. Note that if a semiconductor element such as an IC is used, the semiconductor element is connected to the conductive pattern 16 with metal thin wires.

The encapsulating resin 28 coats the conductive pattern 16 and the circuit element 18 that are formed on the top surface of the circuit board 12. In addition, the single encapsulating resin 28 coats all of the top surface, the side surfaces, and the bottom surface of the circuit board 12. The resin encapsulation including also that of the bottom surface of the circuit board 12 can prevent outside moisture from reaching the circuit board 12 and thus can improve the moisture resistance of the device. The encapsulating resin 28 is made of a resin material added with granular filler of alumina or the like. Some of the possible resin materials that can be used to form the encapsulating resin 28 are such thermosetting resins as epoxy resins and such thermoplastic resins as acrylic resins.

In this embodiment, to improve the heat dissipation from the device as a whole, the encapsulating resin 28 coating the bottom surface of the circuit board 12 is formed thinly to have a thickness T1 of 0.5 mm or smaller. However, this structure poses a difficulty in spreading the encapsulating resin all over the area under the circuit board 12 during the process of resin encapsulation. This embodiment, however, solves the problem by using a mold with a special shape. More details of this solution will be described later by referring to FIGS. 6A-C.

As FIGS. 1A and 1C show, not only does the encapsulating resin 28 of this embodiment encapsulate the circuit board 12 but also portions of the encapsulating resin 28 extend outwards from the sides of the circuit board 12. Specifically, portions of the encapsulating resin 28 extend outwards from the shorter sides of the circuit board 12. In addition, the central portions of these extended portions of the encapsulating resin 28 are depressed in a planar view, and thereby depressed areas 32A and 32B are formed in the central portions. The depressed areas 32A and 32B are used when the hybrid integrated circuit device 10 is screwed to a heat sink or to a mount surface.

In addition, as FIG. 1A shows, recessed areas 30A and 30B are formed respectively on the two sides of the depressed area 32A whereas recessed areas 30C and 30D are formed respectively on the two sides of the depressed area 32B.

The formation of the recessed areas 30A to 30D in the encapsulating resin 28 can reduce the amount of the resin used for the encapsulating resin 28. Consequently, the cost can be cut and the hybrid integrated circuit 10 can be made lighter in weight. In the meanwhile, the portions of the encapsulating resin 28 that surround the recessed areas 30A to 30D have a thickness that is 1.0 mm or larger, which is large enough to give a mechanical strength that enables the screwing of the hybrid integrated circuit 10 at depressed areas 32A and 32B.

As FIG. 1C shows, not only do the recessed areas 30A and 30D exist in portions at the two sides of the circuit board 12 but also portions of the recessed areas 30A and 30D extend over parts of the circuit board 12. Such a structure of the recessed areas 30A and 30D allows further reduction of the amount of the encapsulating resin 28 needed for the encapsulation of the hybrid integrated circuit 10. The other recessed areas 30B and 30C share the feature and the effect.

In addition, an inner side of each of the recessed areas 30A and 30D is not a single plane but has a step-like structure. With this step-like structure, the cure shrinkage of the encapsulating resin 28 coating the top surface of the circuit board 12 can be caused dispersedly in surfaces with different angles of the encapsulating resin 28, and thereby the deformation of the circuit board 12 caused by this cure shrinkage can be reduced.

Figure 2A:
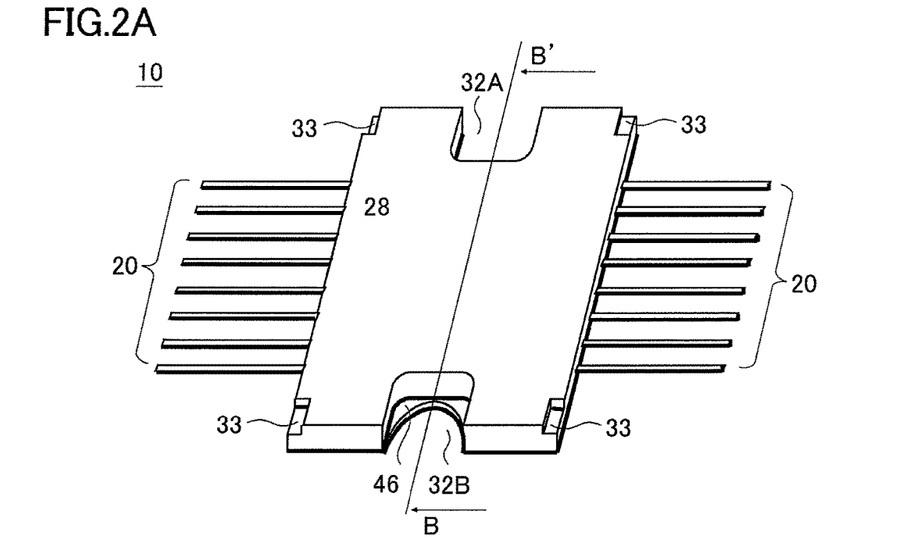
FIG. 2A shows a perspective view of a diagram illustrating the hybrid integrated circuit device of the preferred embodiments of the invention.
Figure 2B:
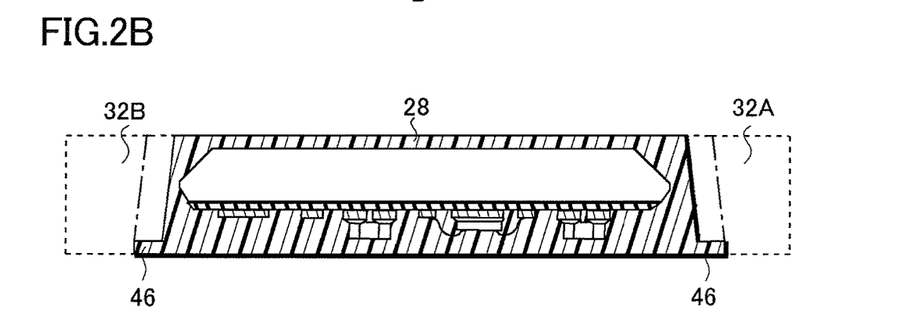
FIG. 2B is a sectional view of the hybrid integrated circuit shown in FIG. 2A.
Figure 2C:
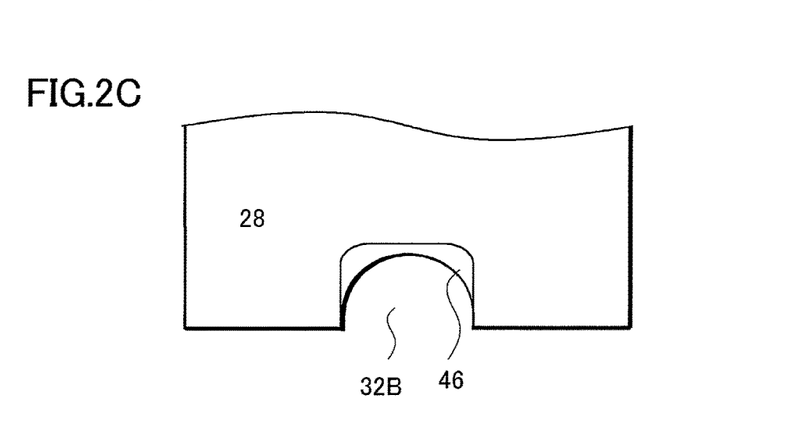
FIG. 2C is a top view of a depressed area of the hybrid integrated circuit shown in FIG. 2A.

The structure of the hybrid integrated circuit device 10 is described further by referring to FIGS. 2A-C. FIG. 2A is a perspective view illustrating the hybrid integrated circuit device 10 of FIG. 1A upside down. FIG. 2B is a sectional view taken along the line B-B' in FIG. 2A. FIG. 2C is a top plan view illustrating the depressed area 32B and its vicinity shown in FIG. 2A.

As FIG. 2A shows, cutaway portions 33 are formed by partially cut away the four corners of the encapsulating resin 28. To be more specific, each of the upper corner portions and its vicinity is cut away to form each cut away portion 33. Each cutaway portion 33 has a cuboid shape formed by cutting away each corner of the encapsulating resin 28 into that shape. The formation of the cutaway portions 33 in the corners of the encapsulating resin 28 can prevent damages, such as cracks, of the encapsulating resin 28 even when an impact or the like is applied to the corners of the encapsulating resin 28.

As FIG. 2A to 2C show, peripheral edge portions 46 are formed in a way that portions of the encapsulating resin 28 around the bottom ends of the depressed areas 32A and 32B are extended inward of the depressed areas 32A and 32B. In a planar view, each of the depressed areas 32A and 32B has a rectangular shape with rounded corners. The inner end portion of each peripheral edge portion 46 has a shape of a portion of a circle or of an ellipse corresponding to the shape of the columnar screw to be inserted in this depressed area 32A or 32B.

To put it differently, in the sectional view of FIG. 2B, the areas above the peripheral edge portions 46 and indicated by the dashed-dotted lines are removed. In order to simplify the external shape of the encapsulating resin 28, the side-surface portions of the encapsulating resin 28 can be extended to the positions aligned with the inner end portions of the peripheral edge portions 46, without the peripheral edge portions 46 additionally formed. In this embodiment, however, the encapsulating resin 28 is formed with the shape shown in FIG. 2B so that the bottom surface (the upper surface in FIG. 2B) of the circuit board 12 can be coated thinly with the encapsulating resin 28. More details of this feature will be described later by referring to FIG. 6C.

Figure 3A:
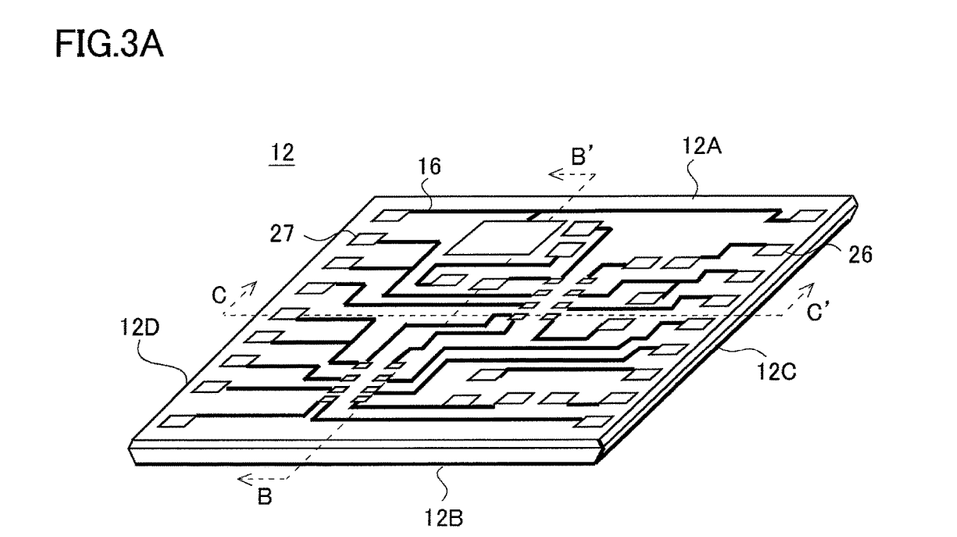
FIG. 3A shows a perspective view of a diagram illustrating the circuit board incorporated in the hybrid integrated circuit device of the preferred embodiments of the invention.
Figure 3B:
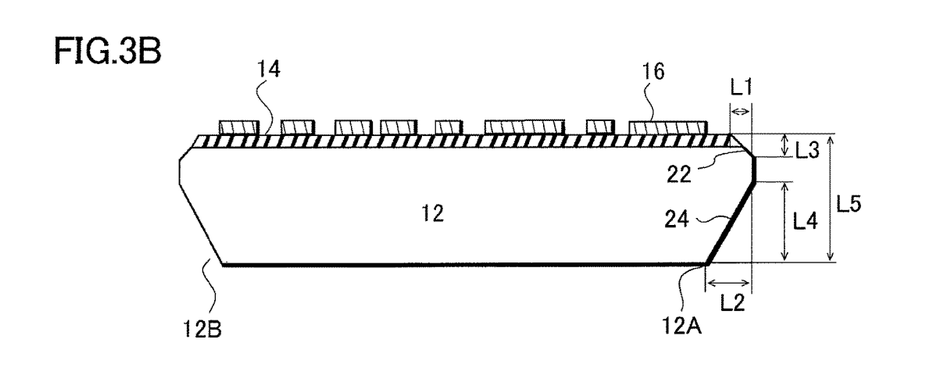
FIG. 3B is a sectional view of the hybrid integrated circuit shown in FIG. 3A.
Figure 3C:
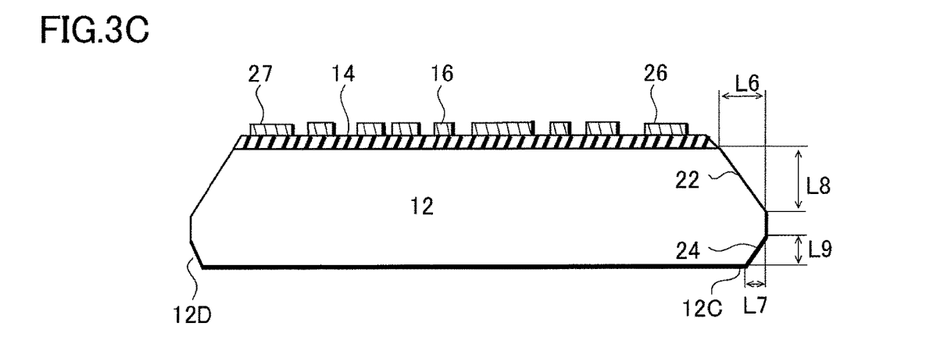
FIG. 3C is another sectional view of the hybrid integrated circuit shown in FIG. 3A.

The configuration of the circuit board that is built in the hybrid integrated circuit device 10 is described below by referring to FIGS. 3A-C. FIG. 3A is a perspective view illustrating the circuit board 12. FIG. 3B is a sectional view taken along the line B-B' in FIG. 3A. FIG. 3C is a sectional view taken along the line C-C' in FIG. 3A.

As FIG. 3A shows, the circuit board 12 has a rectangular shape with a first side-edge 12A, a second side-edge 12B, a third side-edge 12C, and a fourth side-edge 12D. The conductive pattern 16 with a predetermined shape is formed on the insulating layer coating the top surface of the circuit board 12.

The conductive pattern 16 includes lands to which circuit elements are connected and wirings that connect the lands to one another. In addition, pads 26 formed with portions of the conductive pattern 16 that are formed into pad-like shapes are provided along the right-hand side-edge (i.e., third side-edge 12C) of the circuit board 12. Furthermore, pads 27 are formed along the fourth side-edge 12D located on the opposite side of the circuit board 12 to the third side-edge 12C.

In circuit board 12, a side-surface shape of each of the first side-edge 12A and the second side-edge 12B is different from a side-surface shape of each of the third side-edge 12C and the fourth side-edge 12D. Specifically, the first side-edge 12A and the second side-edge 12B have a larger sloping surface on the lower side than on the upper side, but the third side-edge 12C and the fourth side-edge 12D have a larger sloping surface on the upper side than on the lower side.

The side-surface shape of the first side-edge 12A and the second side-edge 12B in the circuit board 12 are described below by referring to FIG. 3B. Specifically, each of the four above-mentioned side surfaces of the circuit board 12 includes a first sloping surface 22 that extends continuously and obliquely outwards from the top surface of the circuit board 12 and a second sloping surface 24 that extends continuously and obliquely outwards from the bottom surface of the circuit board 12. In each of the first side-edge 12A and the second side-edge 12B, the second sloping surface 24 has a width that is larger than the width of the first sloping surface 22. For example, the second sloping surface 24 has a width L2 of 0.4 mm whereas the first sloping surface 22 has a width L1 of 0.1 mm. In addition, the second sloping surface 24 is longer than the first sloping surface 22 in the thickness direction as well. For example, the second sloping surface 24 has a length L4 in the thickness direction of 10.0 mm whereas the first sloping surface 22 has a length L3 in the thickness direction of approximately 0.2 mm. The circuit board 12 has a total thickness L5 of, for example, 1.5 mm. This embodiment improves the fluidity of the encapsulating resin 28 in the process of resin encapsulation by forming the side surface of the first side-edge 12A and that of the second side-edge 12B into the above-described shapes. More details about this feature will be described later by referring to FIG. 6A.

As FIG. 3C shows, the relative dimensions between the first sloping surface 22 and the second sloping surface 24 in each of the third side-edge 12C and the fourth side-edge 12D are opposite those in each of the first side-edge 12A and the second side-edge 12B. Specifically, the width and the thickness of the first sloping surface 22 are greater than their respective counterparts of the second sloping surface 24. For example, the first sloping surface 22 has a width L6 of approximately 0.4 mm, and a height L8 of approximately 10.0 mm. In addition, the second sloping surface 24 has a width L7 of approximately 0.1 mm, and a height L9 of approximately 0.2 mm. Forming each of the third side-edge 12C and the fourth side-edge 12D into the above-described shape has an advantageous effect of preventing voids from occurring in the encapsulating resin 28 under the bottom surface of the circuit board 12 during the process of resin encapsulation. More details about this feature will be described later by referring to FIG. 6B.

<Second Embodiment: Method of Manufacturing Circuit Device>

In this embodiment, a method of manufacturing the circuit device with the above-described configuration is described by referring to FIGS. 4A-C, 5, 6A-C and 7A-C.

Figure 4A:
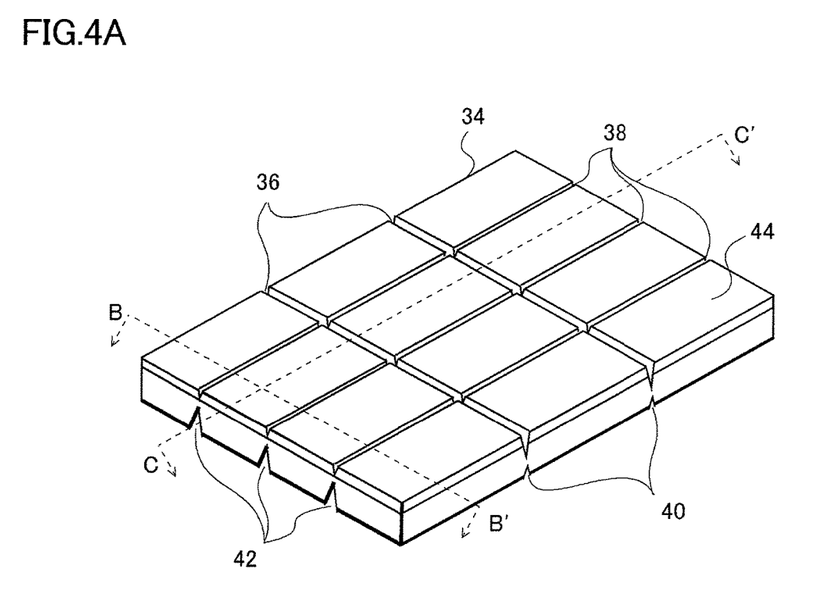
FIG. 4A shows a perspective view of diagrams illustrating a method of manufacturing the hybrid integrated circuit device, the circuit device of the preferred embodiments of the invention.
Figure 4B:
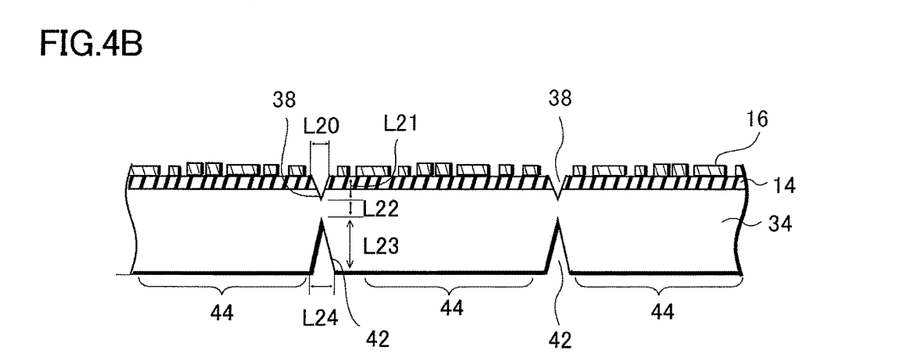
FIG. 4B is a sectional view of the hybrid integrated circuit shown in FIG. 4A.
Figure 4C:
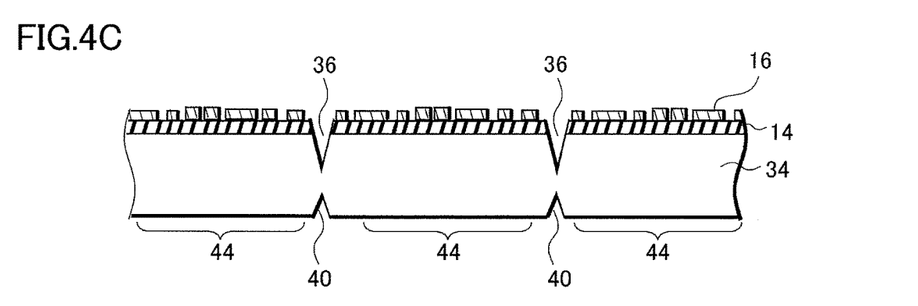
FIG. 4C is another sectional view of the hybrid integrated circuit shown in FIG. 4A.

Firstly, as FIGS. 4A-C shows, grooves with a V-shaped cross section are formed in both the top surface and the bottom surface of a large-sized substrate 34. FIG. 4A is a perspective view illustrating the substrate 34 in which the grooves are formed. FIG. 4B is a sectional view taken along the line B-B' in FIG. 4A. FIG. 4C is a sectional view taken along the line C-C' in FIG. 4A.

As FIG. 4A shows, the substrate 34 is a large-sized substrate from which multiple circuit boards can be formed. Dicing lines are drawn in a lattice shape corresponding to the size of the circuit board to be formed from the substrate 34. A metal substrate made of aluminum or the like is used as the substrate 34. Alternatively, the substrate 34 may be made of a resin material such as glass epoxy, or may be made of ceramics.

In the top surface of the substrate 34, first grooves 36 and second grooves 38 are formed in a lattice shape. The second grooves 38 are shallower than the first grooves 36. In the bottom surface of the substrate 34, third grooves 40 and fourth grooves 42 are formed at positions such that the third grooves 40 correspond respectively to the first grooves 36 and the fourth grooves 42 correspond respectively to the second grooves 38. The third grooves 40, which correspond respectively to the first grooves 36, are shallower than the fourth grooves 42, which correspond respectively to the second grooves 38.

In the top surface of the substrate 34, each single board area 44 is defined as an area surrounded by the first grooves 36 and the second grooves 38. Identical conductive patterns (not illustrated) are formed respectively in the board areas 44.

As FIG. 4B shows, at the border between every two adjacent board areas 44, one of the second grooves 38 is formed from the top surface and one of the fourth grooves 42 is formed from the bottom surface. The second grooves 38 are shallower than the fourth grooves 42. Specifically, each of the shallow second grooves 38 has a width L20 of approximately 0.2 mm and a depth L21 of approximately 0.2 mm. Each of the fourth grooves 42 formed from the bottom surface of the substrate 34 has a width L24 of approximately 0.8 mm and a depth L23 of approximately 10.0 mm. Within the dimension in the thickness direction of the substrate 34, the portion left without any of the two grooves 38 and 43 has a thickness L22 of approximately 0.4 mm.

As FIG. 4C shows, the first grooves 36 formed from the top surface are deeper than the third grooves 40 formed from the bottom surface. Note that the size of each first groove 36 may be the same as that of each fourth groove 42 shown in FIG. 4B, and also that the size of each third groove 40 may be the same as that of each second groove 38 shown in FIG. 4B.

The substrate 34 with the grooves formed in the above-described process is divided at positions where the grooves are formed, and thereby individual board areas 44 are separated from one another to be used as the circuit board 12. The dividing of the substrate 34 may be done by bending the substrate 34 at each border between every two adjacent board areas 44. Alternatively, the substrate 34 may be cut with a cutting device such as a cutter, and thereby the board areas 44 may be separated from one another to be used as the circuit boards 12.

After the separation of the board areas 44 from one another, circuit elements are connected to the conductive pattern 16 formed on the top surface of each board area 44. Specifically, a semiconductor element and/or a chip element shown in FIGS. 1A-C may be soldered to the conductive pattern 16.

Figure 5:
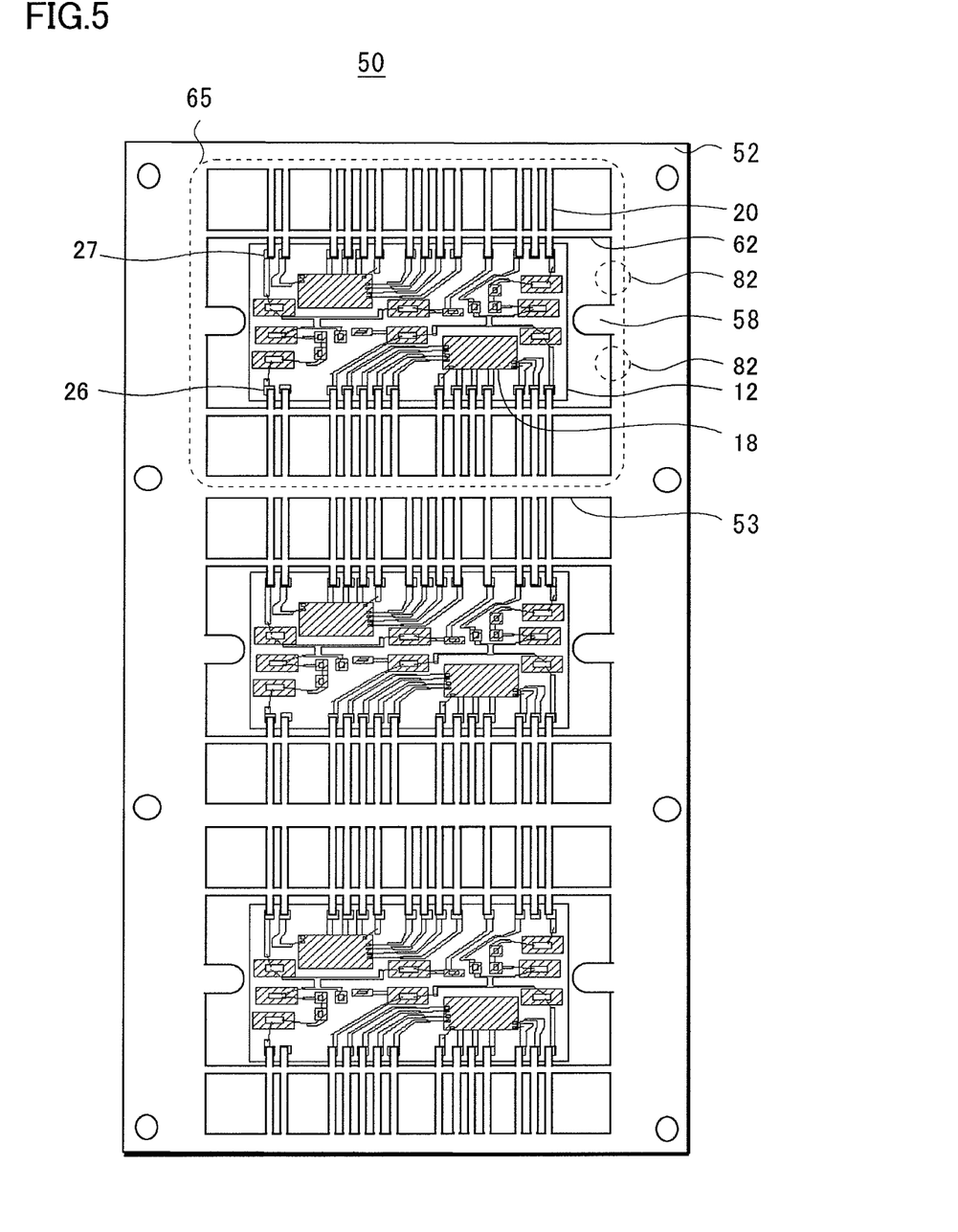
FIG. 5 is a plan view illustrating the method of manufacturing the hybrid integrated circuit device of the preferred embodiments of the invention.

Then as FIG. 5 shows, the circuit boards 12 to each of which the circuit element 18 is connected are fixed to a lead frame 50. The lead frame 50 is a metal plate made of copper or the like with a thickness of approximately 0.1 mm and formed into a predetermined shape, and includes a frame portion 52 and support portions 53. The frame portion 52 has a frame shape, and forms the external shape of the lead frame 50. Each support portion 53 bridges the lengthwise sides of the frame portion 52. An uppermost unit 56 shown in FIG. 5 includes the leads 20 each of which has an end connected to the frame portion 52 and also includes the leads 20 each of which has an end connected to the corresponding support portion 53. The unit 56 herein refers to the plural leads 20 that form a single circuit device. Linking portions 62 (tie bars) are provided to link together the vicinities of the leading-end portions of the leads 20. The left-hand end portion and the right-hand end portion of each linking portion 62 are connected to the frame portion 52. Projection areas 58 are formed in the frame portion 52 by projecting inwards some parts of the frame portion 52. The projection areas 58 thus formed are the areas where the depressed areas 32A and 32B shown in FIG. 1A are to be formed.

In this manufacturing process, end portions of the leads 20 are soldered to the pads 26 and 27 provided on the top surface of each circuit board 12. Thus each circuit board 12 is fixed to the lead frame 50. In this embodiment, three circuit boards 12 are fixed to the lead frame 50, and the next manufacturing process, that is, the process of resin encapsulation is performed on the circuit boards 12 in this state.

In FIG. 5, dashed-lined circles indicate the positions where gates 82 are formed. The resin used in a later process of encapsulating the circuit board 12 is introduced through each of the gates 82. In the example shown in FIG. 5, two gates 82 are formed at the two sides of each projection area 58, but only one of the two gates 82 may be formed instead.

Then, as FIGS. 6A-C and 7A-C shows, each circuit board 12 is encapsulated with resin. The resin encapsulation in this manufacturing process is done by the transfer molding technique using a set of molds.

Figure 6A:
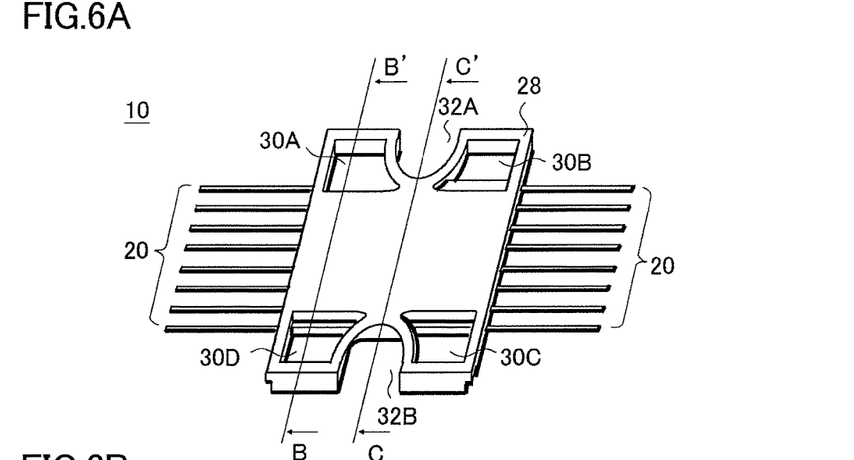
FIG. 6A is a diagram illustrating encapsulating resin formed in a method of manufacturing a hybrid integrated circuit device of a preferred embodiment of the invention.
Figure 6B:
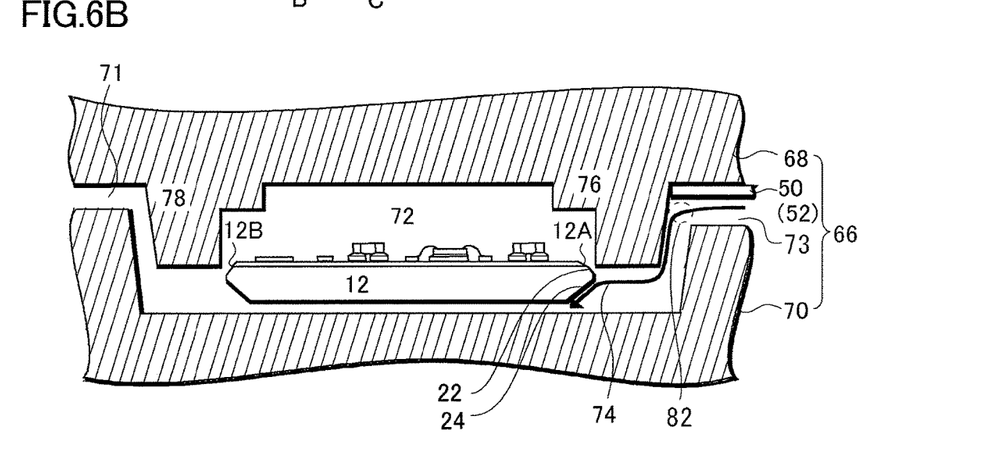
FIG. 6B is a sectional view illustrating the method of manufacturing the hybrid integrated circuit device shown in FIG. 6A.
Figure 6C:
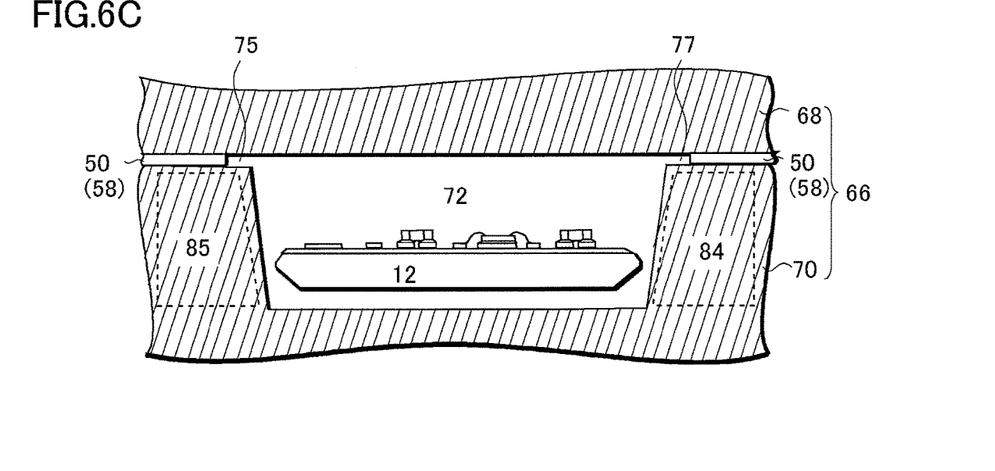
FIG. 6C is another sectional view illustrating the method of manufacturing the hybrid integrated circuit device shown in FIG. 6A.

The resin encapsulation performed in this manufacturing process is described by referring to FIGS. 6A-C. FIG. 6A is a perspective view illustrating the encapsulating resin 28 fabricated in this manufacturing process. FIG. 6B is a sectional view illustrating a set of molds taken along the line B-B' in FIG. 6A. FIG. 6C is a sectional view illustrating the set of molds taken along the line C-C' in FIG. 6A.

As FIG. 6B shows, a set of molds 66 used in this manufacturing process includes an upper mold 68 and a lower mold 70. If the two molds 68 and 70 are brought into contact with each other, a cavity 72 is formed as a gap between the two molds 68 and 70.

A guiding portion 76 is formed by projecting downwards a portion of the upper mold 68 corresponding to the right-hand side portion of the circuit board 12. The shape of the guiding portion 76 is formed by transferring the shape of the recessed area 30A shown in FIG. 6A. To put it differently, the guiding portion 76 has a protruding shape corresponding to the recessed shape of the recessed area 30A. This feature is also applied to a guiding portion 78 located in an area corresponding to the left-hand side portion of the circuit board 12. The shape of the guiding portion 78 is formed by transferring the shape of the recessed area 30D shown in FIG. 6A.

The lower end portion of the guiding portion 76 is positioned below the level corresponding to the top surface of the circuit board 12. This structure allows encapsulating resin 74 to flow smoothly downwards in FIG. 6B along the guiding portion 76. In addition, it is more preferable that the lower end of the guiding portion 76 be positioned below the level corresponding to the upper end of the second sloping surface 24 of the circuit board 12. This structure has a larger effect of allowing the encapsulating resin 74 to flow along the guiding portion 76 to the area under the circuit board 12.

The set of molds 66 has a gate 82, a runner 73, and an air vent 71. The gate 82 is an opening through which the encapsulating resin is introduced into the cavity 72. The runner 73 is a route through which the encapsulating resin to be introduced into the cavity 72 flows. The air vent 71 is a hole through which the air is discharged from the cavity 72 to the outside of the set of the molds 66. Either one gate 82 or two gates 82 are formed for each single cavity 72 (see FIG. 5).

As FIG. 6C shows, protruding portions 84 and 85 are formed in the lower mold 70. The shapes of the protruding portions 84 and 85 are formed by transferring the depressed areas 32A and 32B shown in FIG. 6A. The top surfaces of the protruding portions 84 and 85 are in contact respectively with the bottom surfaces of the projection areas 58 of the lead frame 50. The inner-side wall of each of the protruding portions 84 and 85 is located on an inner side of the corresponding projection area 58 of the lead frame 50. A space 77 is formed between the top surface of the vicinity of the inner-side end of the protruding portion 84 and the bottom surface of the upper mold 68. The height of the space 77 is the same as the thickness of each projection area 58 of the lead frame 50. Likewise, a space 75 is formed between the top surface of the vicinity of the inner-side end of the protruding portion 85 and the bottom surface of the upper mold 68. The height of the space 75 is the same as the thickness of each projection area 58 of the lead frame 50. The peripheral edge portions 46 shown in FIG. 2A and the like are formed by filling the spaces 75 and 77 with the encapsulating resin.

Description is given below of a method of encapsulating the circuit board 12 with resin by using the set of molds 66 with the above-described structure.

Firstly, as FIG. 6B shows, the lead frame 50 to which the circuit board 12 is fixed is placed on the top surface of the lower mold 70. As FIG. 5 shows, three circuit boards 12 are fixed to the lead frame 50 of this embodiment. The circuit boards 12 are set individually in cavity areas formed in the lower mold 70.

In addition, the frame portion 52 of the lead frame 50 of this embodiment is placed so that the frame portion 52 can close the corresponding groove-shaped runner 73 formed in the lower mold 70. Thus, the bottom surface of the frame portion 52 of the lead frame 50 becomes the ceiling of the frame portion 52.

Then, the upper mold 68 and the lower mold 70 are brought into contact with each other. Thus, each circuit board 12 is set in the corresponding cavity 72. In the meanwhile, the upper mold 68 and the lower mold 70 clamp the frame portions 52 of the lead frame 50, so that the position of each circuit board 12 within the corresponding cavity 72 is determined. In addition, the top surface of the circuit board 12 with the circuit elements mounted thereon faces the internal wall of the upper mold 68. Furthermore, as FIG. 6C shows, the projection areas 58 of the lead frame 50 are brought into contact with the internal walls of the protruding portions 84 and 85 of the lower mold and with the internal wall of the upper mold 68.

Then, the encapsulating resin 74 either in a liquid state or in a semi-solid state is introduced from an unillustrated pod through both the runner 73 and the gates 82 into the cavity 72. The encapsulating resin 74 is made of a thermosetting resin, such as an epoxy resin, added with inorganic granular filler, such as alumina. The encapsulating resin 74 is heated to be in a molten state before being supplied to the set of molds 66.

Once the encapsulating resin 74 is introduced into the cavity 72, the encapsulating resin 74 flows along the side surface of the guiding portion 76, and then along the side surface of the circuit board 12. After that, the encapsulating resin 74 is filled into the gap left between the bottom surface circuit board 12 and the internal wall of the lower mold 70. Once the filling of the encapsulating resin 74 into this gap is finished, the encapsulating resin 74 is introduced into the portion of the cavity 72 located over the circuit board 12 to encapsulate, with resin, both the circuit board 12 and the circuit elements mounted on the top surface of the circuit board 12. As the resin encapsulation of this manufacturing process progresses, the air in the cavity 72 is discharged to the outside through the air vent 71 formed in the opposite side of the set of molds 66 to the gates 82.

Once the inside of the cavity 72 is filled with the encapsulating resin 74, the encapsulating resin 74 is heated and cured in a heating-and-curing process. Then, the upper mold 68 and the lower mold 70 are separated away from each other, so that the circuit boards 12 each encapsulated with resin are taken out of the set of molds 66.

Once the process of resin encapsulation is finished, the leads 20 of each unit 56 are separated from either the frame portion 52 or the support portions 53 of the lead frame 50 as FIG. 5 shows. This separation is done by a punching process using a die.

The hybrid integrated circuit device 10 whose structure is shown in FIGS. 1A-C is manufactured through the series of manufacturing processes described above.

This embodiment is characterized in that the guiding portion 76 formed in the upper mold 68 of the set of molds 66 helps the encapsulating resin 74 flow into the gap under the circuit board 12.

The guiding portion 76 provided in this embodiment directs the flow of the encapsulating resin 74 towards the portion under the circuit board 12. As described earlier, the guiding portion 76 is formed by projecting downwards a portion of the internal wall of the upper mold 68 corresponding to the right-hand side portion of the circuit board 12. The right-hand side surface of the guiding portion 76 is a sloping surface that slopes inwards towards the bottom. Accordingly, once introduced into the cavity 72, the encapsulating resin 74 flows along the side surface of the guiding portion 76 and thereby moves preferentially into the portion under the circuit board 12.

In addition, the gap between the end portion of the guiding portion 76 and the circuit board 12 is narrow, and a part of the guiding portion 76 that is formed into a step-like shape is located above the circuit board 12. Hence, the encapsulating resin 74 introduced into the cavity 72 is prevented from being introduced into the space above the circuit board before the space under the circuit board 12 is filled with the encapsulating resin 74.

In addition, the frame portion 52 of the lead frame 50 forms a part of the runner 73 in this embodiment, and thus the gates 82 are located at higher positions than the circuit board 12. In this embodiment, even under the conditions described above, the guiding portion 76 forces the encapsulating resin 74 to flow downwards, and thereby the space under the circuit board 12 is filled with the encapsulating resin 74.

In addition, the circuit board 12 of this embodiment has side surfaces with shapes that facilitate the downward flow of the encapsulating resin 74. Specifically, as described earlier, each of the side surfaces of the circuit board 12 includes the first sloping surface 22 and the second sloping surface 24. In the side surface of the circuit board 12 that the introduced encapsulating resin 74 is brought into contact with, the second sloping surface 24 is larger than the first sloping surface 22. To put it differently, the second sloping surface 24 has a larger area than the first sloping surface 22.

Hence, the encapsulating resin 74 that has been introduced through the gates 82 into the cavity 72 and has moved along the guiding portion 76 moves further along the second sloping surface 24 of the circuit board 12 and then fills the gap between the circuit board 12 and the lower mold 70. Accordingly, the encapsulating resin 74 is introduced into the narrow gap under the circuit board 12 without forming voids.

In addition, as FIG. 6C shows, the small distance between each of the protruding portions 84 and 85 and the circuit board 12 in this embodiment prevents the encapsulating resin 74 having flowed in the portion under the circuit board 12 from moving into the portion above the circuit board 12. Specifically, the protruding portions 84 and 85 are provided to form the depressed areas 32A and 32B for screwing shown in FIG. 6A. So, if the external shape of the encapsulating resin 28 needs to be simplified, the inner-side ends of the protruding portions 84 and 85 have to be located at the same positions corresponding to the inner-side ends of the projection areas 58 of the lead frame 50 so that the shapes of the inner-side ends of the protruding portions 84 and 85 can be fit to the screws to be inserted. The structure described above, however, widens each of the gaps formed between the inner side surfaces of the protruding portions 84 and 86 and the corresponding end portion of the circuit board 12, and the wider gap thus created allows the encapsulating resin 74 that has flowed in the portion under the circuit board 12 to move into the portion above the circuit board 12. To prevent this movement of the encapsulating resin 74, the internal walls of the protruding portions 84 and 85 of this embodiment are located at positions inward of the end portions of the projection areas 58 of the lead frame 50. Accordingly, the gaps formed between the protruding portions 84 and 85 and the corresponding end portions of the circuit board 12 become narrower. Thus prevented is the movement of the encapsulating resin 74 from the portion under the circuit board 12 to the portion above the circuit board 12 through the gaps. Consequently, voids can be prevented from being formed in the portion under the circuit board 12.

Figure 7A:
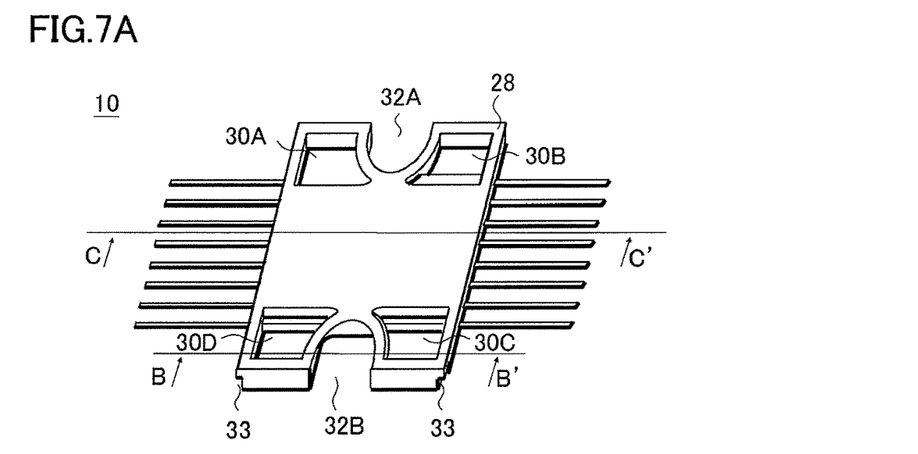
FIG. 7A shows a diagram illustrating encapsulating resin formed in the method of manufacturing the hybrid integrated circuit device of the preferred embodiments of the invention.
Figure 7B:
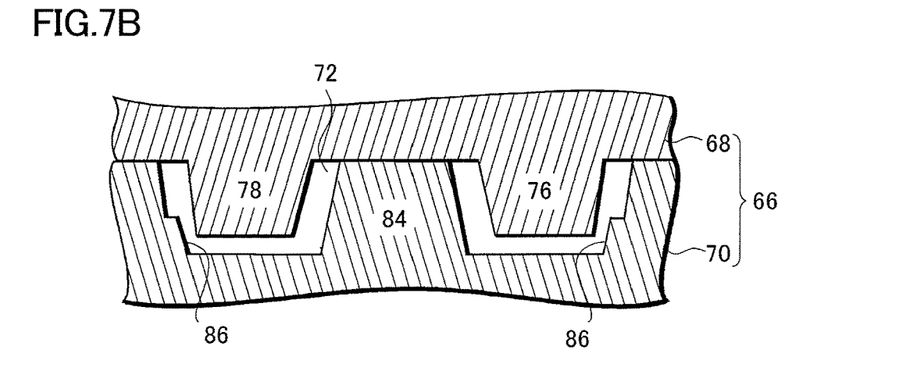
FIG. 7B is a sectional view illustrating the manufacturing process shown in FIG. 7A.
Figure 7C:
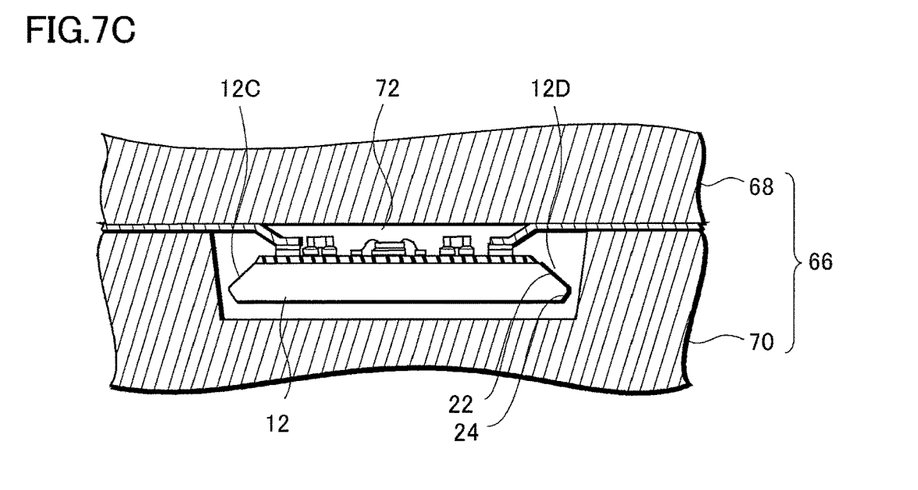
FIG. 7C is another sectional view illustrating the manufacturing process shown in FIG. 7A.

Another configuration to prevent the flow of the resin is described below by referring to FIGS. 7A-C. FIG. 7A is a perspective view illustrating a hybrid integrated circuit device 10 to be manufactured. FIG. 7B is a sectional view of a set of molds 66 used in the resin encapsulation taken along the line B-B' in FIG. 7A. FIG. 7C is a sectional view of the set of molds 66 used in the resin encapsulation taken along the line C-C' in FIG. 7A.

As FIG. 7B shows, each of guiding portions 76 and 78 is formed by projecting downwards a portion of an upper mold 68. A protruding portion 84 is formed by projecting upwards a portion of a lower mold 70. The protruding portion 84 is located between guiding portion 76 and the guiding portion 78. The guiding portions 76 and 78 are used to form respectively recessed areas 30C and 30D shown in FIG. 7A. The protruding portion 84 is used to form a depressed area 32B shown in FIG. 7A.

In this embodiment, protruding portions 86 are formed by projecting inwards portions of the corners of the lower mold 70. The protruding portions 86 are substantially cuboid-shaped portions formed by making the four corners of the internal walls of the lower mold 70 protrude inwards. The forming of the protruding portions 86 allows cutaway portions 33 to be formed as shown in FIG. 7A. The upper end of each protruding portion 86 is preferably located above the lower ends of the guiding portions 76 and 78. With this structure, a larger effect of guiding the flow of the encapsulating resin in a manner described below can be obtained.

The protruding portions 86 thus formed narrow the distances between the internal walls of the lower mold 70 and each of the guiding portions 76 and 78 in the regions where the protruding portions 86 are formed. Hence, the encapsulating resin 74 that has flowed in the portion under the circuit board 12 (see FIG. 6B) is prevented from moving into the upper portion of the cavity through the gaps between each of the guiding portion 76 and 78 and the corresponding internal wall of the lower mold 70. Also with this structure, the voids can be prevented from being formed in a portion under the circuit board 12.

In this embodiment, as FIG. 7C shows, in each of the side surfaces of the circuit board 12 corresponding to the third side-edge 12C and the fourth side-edge 12D, a lower, second sloping surface 24 is smaller than an upper, first sloping surface 22. Hence, as the internal-wall side surfaces of the lower mold 70 are sloping surfaces each of which becomes wider towards above, the gaps between the internal-wall side surfaces of the lower mold 70 and the corresponding end portions of the circuit board 12 become smaller. Accordingly, the encapsulating resin 74 that has been filled in the portion under the circuit board 12 is prevented from moving into the space above the circuit board 12 through the gaps.

According to preferred embodiments of the invention, a recessed area is formed at a side portion of the circuit board by recessing a portion of the encapsulating resin in the thickness direction. Hence, even if a fixation portion for screwing or the like is formed in a portion of the encapsulating resin at a side of the circuit board, the necessary amount of the encapsulating resin can be reduced and the cost can be reduced as well.

In addition, the providing of the recessed area at a side of the circuit board has the following effect. Even if a stress is generated by the curing by heating of the encapsulating resin coating the top surface of the circuit board, the circuit board 12 is reinforced by the recessed area. Accordingly, the warpage of the circuit board by the stress can be avoided.

In addition, concerning the manufacturing method, as the guiding portions to guide the flow of the encapsulating resin introduced through the gates in the process of resin encapsulation are provided at the two sides of the circuit board, the encapsulating resin guided by the guiding portion flows into the portion under the circuit board. Hence, even if the gap between the internal wall of the mold and the bottom surface of the circuit board is small, the small gap is preferentially filled with the encapsulating resin. Accordingly, the voids can be prevented from being formed in the portion under the circuit board.

What is claimed is:

1. A method of manufacturing a circuit device comprising:
    preparing a circuit board having a conductive pattern and a circuit element mounted on a top surface of the circuit board;
    setting the circuit board in a cavity of a set of molds including an upper mold and a lower mold so that the top surface of the circuit board faces an internal wall of the upper mold; and
    injecting encapsulating resin through a gate adjacent to the cavity, and thereby coating the top surface, side surfaces, and bottom surface of the circuit board within the encapsulating resin,
    wherein a guiding portion is formed by projecting downwards a portion of the internal wall of the upper mold located in a region between the circuit board and the gate,
    the encapsulating resin is made to flow along the guiding portion into a gap between the bottom surface of the circuit board and an internal wall of the lower mold,
    the circuit board has first and second side surfaces facing each other in a first direction, and third and fourth side surfaces facing each other in a second direction,
    a plurality of leads drawn outside the encapsulating resin are fixed along both of the first side surface and the second side surface,
    any one of the third side surface and the fourth side surface is placed near the gate adjacent to the cavity,
    the first and second side surfaces have a larger sloping surface on a first side of the circuit board than on a second side of the circuit board, and
    the third and fourth side surfaces both have a larger sloping surface on the second side of the circuit board than on the first side of the circuit board.

2. The method of manufacturing a circuit device according to claim 1, wherein the guiding portion has a bottom end located at a level below the top surface of the circuit board.

3. The method of manufacturing a circuit device according to claim 1, wherein a portion of the guiding portion is located above the circuit board.

4. The method of manufacturing a circuit device according to claim 1, wherein one of the side surfaces of the circuit board that is near the gate includes:
    a first sloping surface extending continuously and obliquely outwards from the top surface of the circuit board; and
    a second sloping surface extending continuously and obliquely outwards from the bottom surface of the circuit board and having a larger area than the first sloping surface, and
    the encapsulating resin is made to flow along the second sloping surface of the circuit board in the step of injecting the encapsulating resin.

5. The method of manufacturing a circuit device according to claim 1, wherein a portion of the lower mold protrudes inwards, thereby decreasing a gap between the guiding portion of the upper mold and the internal wall of the lower mold.

6. The method of manufacturing a circuit device according to claim 1, wherein the circuit board is connected to a lead frame which is set in the set of molds, and a surface of the lead frame forms a portion of a runner through which the encapsulating resin to be supplied to the cavity flows.

7. The method of manufacturing a circuit device according to claim 1, wherein:
    the lower mold is provided with a protruding portion at a side of the circuit board, the protruding portion formed by protruding a portion of the internal wall of the lower mold inwards of the cavity in a plan view,
    the circuit board is connected to a lead frame which is set in the set of molds,
    a projection area of the lead frame formed by projecting a portion of the lead frame inwards of the cavity is clamped by the upper mold and the protruding portion of the lower mold, and
    an inner-side end of the protruding portion of the lower mold is located on an inner side of the projection area of the lead frame.

8. The method of manufacturing a circuit device according to claim 1, wherein the circuit element comprises one of a capacitor, a resistor, a transistor, or an integrated circuit.

9. The method of claim 1, wherein the encapsulating resin forms a recessed area having a portion disposed above the top surface of the circuit board.

10. A method comprising:
    disposing a circuit board in a cavity formed between a first mold and a second mold, wherein a top surface of the circuit board comprises a circuit element, and wherein the top surface faces an internal wall of the first mold;
    flowing an encapsulating resin along a guiding portion formed between the first mold and the second mold so that the encapsulating resin fills an opening between a bottom surface of the circuit board and the second mold, wherein the encapsulating resin does not flow into an opening between the top surface of the circuit board and the first mold before the opening between the bottom surface of the circuit board and the second mold is filled;
    flowing the encapsulating resin into the opening between the top surface of the circuit board and the first mold; and
    curing the encapsulating resin.

11. The method of claim 10, wherein the guiding portion has a bottom end located at a level below the top surface of the circuit board.

12. The method of claim 10, wherein the cured encapsulating resin forms a recessed area having a portion disposed above the top surface of the circuit board.

13. The method of claim 10, wherein a side-edge of the circuit board comprises a sloping surface that extends obliquely outward from the bottom surface of the circuit board, and wherein the method comprises flowing the encapsulating resin along the guiding portion toward the sloping surface of the side-edge of the circuit board.

14. The method of claim 10, wherein a portion of the second mold protrudes inwards, thereby decreasing a gap between the guiding portion formed between the first mold and the second mold and an internal wall of the second mold.

15. The method of claim 10, wherein at least a portion of the guiding portion is located above the top surface of the circuit board.

16. The method of claim 10, wherein the circuit element comprises one of a capacitor, a resistor, a transistor, or an integrated circuit.

17. A method comprising:
providing a circuit board having a conductive pattern and an integrated circuit mounted on a top surface of the circuit board, wherein a first side surface of the circuit board comprises (i) a first sloping surface extending continuously and obliquely outwards from the top surface of the circuit board and (ii) a second sloping surface extending continuously and obliquely outwards from a bottom surface of the circuit board, wherein the second sloping surface has a larger area than the first sloping surface;
disposing the circuit board in a cavity of a set of molds comprising an upper mold and a lower mold so that the top surface of the circuit board faces an internal wall of the upper mold; and
injecting encapsulating resin such that it flows along a runner before passing through a gate adjacent to the cavity to encapsulate the circuit board within the encapsulating resin,
wherein a guiding portion is formed by projecting downwards a portion of the internal wall of the upper mold located in a region between the circuit board and the gate, and
the encapsulating resin is made to flow along the guiding portion towards the second sloping surface of the first side surface of the circuit board and into a gap between the bottom surface of the circuit board and an internal wall of the lower mold,
wherein the encapsulating resin does not flow into a gap between the top surface of the circuit board and the upper mold before the gap between the bottom surface of the circuit board and the internal wall of the lower mold is filled.

18. The method of claim 17, wherein the encapsulating resin forms a recessed area having a first portion above the top surface of the circuit board, a second portion above the first sloping surface of the first side surface of the circuit board, and a third portion above a region of the encapsulating resin extending outward from the first side surface.

19. The method of claim 17, wherein the encapsulating resin is injected through a gate positioned higher than the top surface of the circuit board.

20. The method of claim 19, wherein the guiding portion has a bottom end located at a level below the top surface of the circuit board.

* * * * *